United States Patent [19]

Enderson

[11] Patent Number: 5,060,299
[45] Date of Patent: Oct. 22, 1991

[54] RADIO FREQUENCY MIXER CIRCUIT UTILIZING INTERFACE TRANSFORMERS AND SWITCHING DIODES

[75] Inventor: Eugene S. Enderson, Robins, Iowa

[73] Assignee: Rockwell International Corporation, El Segundo, Calif.

[21] Appl. No.: 414,894

[22] Filed: Sep. 29, 1989

[51] Int. Cl.$^5$ .............................................. H04B 1/26
[52] U.S. Cl. .................................. 455/326; 455/330; 455/332
[58] Field of Search ............... 455/323, 325, 326, 330, 455/332, 189, 191; 329/323, 358, 361; 332/172, 178; 307/256, 259, 498, 529, 282, 286; 363/158, 159

[56] References Cited

U.S. PATENT DOCUMENTS

| | | |
|---|---|---|
| 2,898,462 | 8/1959 | Karlson . |
| 2,941,093 | 6/1960 | Merel . |
| 3,038,762 | 6/1962 | Beatrice . |
| 3,727,078 | 4/1973 | Wollesen ............................ 307/233 |
| 3,797,384 | 6/1957 | Brown . |
| 4,317,230 | 2/1982 | Boubouleix . |
| 4,467,442 | 8/1984 | Ramer . |
| 4,601,063 | 7/1986 | Price ................................ 455/317 |

FOREIGN PATENT DOCUMENTS 1298448  6/1962  France .

Primary Examiner—Reinhard J. Eisenzopf
Assistant Examiner—Chi H. Pham
Attorney, Agent, or Firm—John J. Horn; M. Lee Murrah; H. Fredrick Hamann

[57] ABSTRACT

A diode mixer characterized by low levels of intermodulation distortion. The mixer circuit includes a center-tapped input transformer for coupling the circuit to local oscillator and radio frequency signal sources and a center-tapped output transformer for coupling the circuit to an intermediate frequency load. The circuit also includes an arrangement of transformers and switching diodes for interfacing the input transformer to the output transformer and applying the local signals and radio frequency signals to the secondary output transformer in a special manner while favorably back-biasing diodes which are in the off condition for more rapid switching action.

15 Claims, 4 Drawing Sheets

HIGH LEVEL
MIXER CIRCUIT

RADIO FREQUENCY MIXER CIRCUIT UTILIZING INTERFACE TRANSFORMERS AND SWITCHING DIODES

BACKGROUND OF THE INVENTION

The present invention relates to mixer circuits for generating intermediate frequency signals that retain the modulation characteristics of an original modulated carrier wave and, more particularly, to balanced diode mixers exhibiting low levels of intermodulation distortion.

Balanced mixers using matched diodes and center-tapped transformers have come into wide spread use as components in VHF and UHF communication systems. Such mixers exhibit low levels of intermodulation distortion and good isolation between the various input and output ports to the mixer circuit. Nevertheless, conventional diode mixers are subject to substantial amounts of intermodulation distortion and typically exhibit third order intermodulation intercept points of 10-20 dBm. For many high performance applications, it is desirable to reduce the amount of intermodulation distortion and increase the level of the intercept point, thereby also substantially expanding the effective dynamic range of the mixer. In the past, it has only been possible to achieve such performance levels through the use of complex mixer circuitry requiring 10 to 30 separate circuit components to construct a single mixer which may be 10 to 20 times more expensive than conventional mixer devices.

It is therefore an object of the present invention to provide an improved mixer circuit characterized by low levels of intermodulation distortion and, in particular, having high second and third order intercept points.

It is another object of the present invention to provide an improved mixer circuit of moderate complexity which may be constructed from 5 to 15 separate components and which is relatively low cost in view of its performance.

It is a further object of the present invention to provide an improved mixer circuit having good balance and exhibiting therefore substantial isolation between the various mixer ports and also having a favorable conversion loss and a low noise figure.

SUMMARY OF THE INVENTION

The present invention comprises a mixer circuit including an input transformer, an output transformer and a special sub-circuit for interfacing the input transformer to the output transformer. The input transformer couples the mixer circuit to a radio frequency signal source and a local oscillator signal source. The output transformer includes a center-tapped secondary coil connected to the interface sub-circuit and a primary coil coupled to an intermediate frequency load. A bias resistor is connected to the center tap of the secondary coil of the output transformer for handling current flow arising from the action of the local oscillation signal source. In the preferred embodiment, the interface sub-circuit comprises two separate center-tapped transformers and a set of diodes connecting the end terminals of the secondaries of these transformers to the secondary of the output transformer.

In operation, the arrangement of the circuit and especially of the interface sub-circuit applies the local oscillator signal to the secondary of the output transformer in a "push-push" mode whereby the signals applied to the opposite end terminals of the secondary of the output transformer are in phase. Concurrently, the arrangement of the mixer circuit and especially the interface sub-circuit applies the radio frequency signal to the secondary of the output transformer in a "push-pull" mode whereby the signals applied to the end terminals of the secondary of the output transformer are 180° out of phase. Further, the interface sub-circuit is adapted for "doubly" back-biasing the diodes that are currently in the off condition so that the switching action of the diodes is improved.

The preferred embodiment of the present invention also includes specially constructed transformers which are symmetrically wound for balanced operations. These transformers are characterized by an arrangement of windings around a torodial core in which the primary coil includes turns wound in between and equally spaced apart from the turns of the secondary coil. In an alternative embodiment, baluns and auto-transformers are used for coupling the inputs and outputs into and out from the mixer circuit in order to yet further improve the operational balance exhibited by the mixer circuit.

DESCRIPTION TO THE PREFERRED EMBODIMENT

Figure 1:
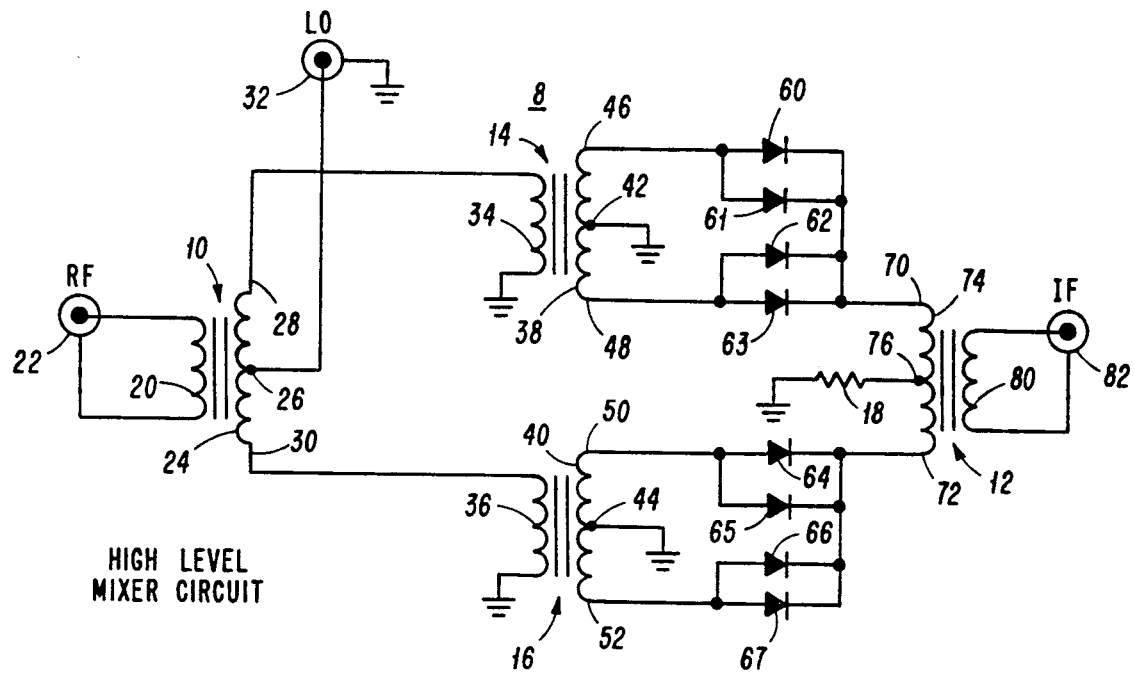
FIG. 1 provides a schematic diagram showing the construction and arrangement of a mixer circuit in accordance with the present invention.

Referring now to FIG. 1, a mixer circuit 8 in accordance with the present invention comprises an input transformer 10, an output transformer 12, interface transformers 14 and 16, diodes 60-67, and bias resistor 18. The input transformer 10 includes a primary coil 20 across which a radio frequency signal source 22 is connected. The radio frequency signal source 22 may include an antenna and a first RF amplification stage for providing a suitable radio frequency signal comprising a modulated carrier wave of selected frequency. The input transformer 10 also includes a center-tapped secondary coil 24 having a center tap terminal 26 and two opposite end terminals 28 and 30. The center tap terminal 26 is connected to a local oscillator signal source 32 which supplies a high frequency square wave type signal for mixing with the signals provided by the radio frequency signal source 22 which is of substantially greater amplitude than the signal provided by the radio frequency source 22.

The end terminals 28 and 30 of the input transformer 10 are connected to the primary coils 34 and 36 of the interface transformers 14 and 16. The transformers 14 and 16 also include the center-tapped secondary coils 38 and 40 having center tap terminals 42 and 44, as well as end terminals 46, 48, 50 and 52. The primary coils 34 and 36 of the transformers 14 and 16 are grounded opposite their connections to the secondary 24 of the input transformer 10 as are the center tap terminals 42 and 44 of the secondary coils 38 and 40.

The diodes 60–67 interconnect the end terminals 46, 48, 50 and 52 to the secondary coils 38 and 40 of the interface transformers 14 and 16 to the end terminals 70 and 72 of the primary coil 74 of the output transformer 12. More specifically, the diodes 60 and 61 interconnect the end terminal 46 of the interface transformer 14 to the end terminal 70 of the output transformer 12. The diodes 62 and 63 interconnect the end terminal 48 of the interface transformer 14 to the end terminal 70 of the output transformer 12. The diodes 64 and 65 interconnect the end terminal 50 of the interface transformer 16 to the end terminal 72 of the output transformer 12. The diodes 66 and 67 interconnect the end terminal 52 of the interface transformer 16 to the end terminal 72 of the output transformer 12. The diodes 60–67 are arranged so that their cathodes are connected to the end terminals 70 and 72 of the primary coil 74 of the output transformer 12 and their anodes are connected to the end terminals 46, 48, 50 and 52 of the interface transformers 14 and 16. The output transformer 12 includes the primary coil 74 which has a center tap 76 connected to ground through the bias resistor 18 and a secondary coil 80 across which the intermediate frequency load 82 is connected.

Figure 2:
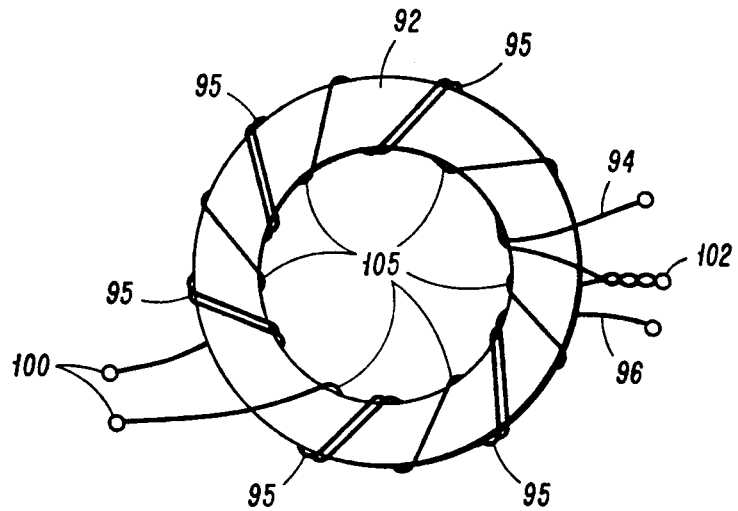
FIG. 2 provides enlarged top view of the actual physical construction of one of, the transformer components shown in FIG. 1 showing the arrangement of windings on the transformer core.

The transformers 10, 12, 14 and 16 comprise single and bifilar windings on a common toroidal core of ferrite material which are carefully constructed to insure that the coils are symmetrically wound. As shown in FIG. 2, the secondary coil includes two separate wires 94 and 96 which are contactually wound around the toroidal core 92 together so as to form a single combined set of turns 95 with end terminals 100 positioned on the same side of the core 92 as the center tap terminal 102. The primary coil of the transformer includes a single set of turns 105 wound in between the turns 95 of the secondary coil so as to be equally spaced apart from the turns 95 of the secondary coil. This pattern for winding the primary and secondary coils on a toroidal core provides greater symmetry than may be achieved by contactually winding all of the turns together and enables the mixer to perform with better balance and a lesser level of parasitic capacitance arising within the transformers.

The diodes 60–67 comprise matched hot carrier diodes which are very fast and exhibit relatively small amounts of resistance. The diodes 60–67 are used in pairs in order to increase the power handling capacities of the circuit and reduce the affective resistance along the branches of the circuit in which the diodes are employed. The bias resistor 18 is selected to act as a load for and terminate the local oscillator signal source 32 thereby providing extra back bias for the diodes which are in the off condition.

When the local oscillator signal source 32 switches polarity, this extra back bias allows the diodes 60–67 to switch more rapidly from fully off to fully on conditions. This back-biasing is believed to decrease the transit time through the non-linear region of the diode during switching operations, reduce the varacap effects of the diode, and accordingly, limit the production of distortion products.

Figure 3A:
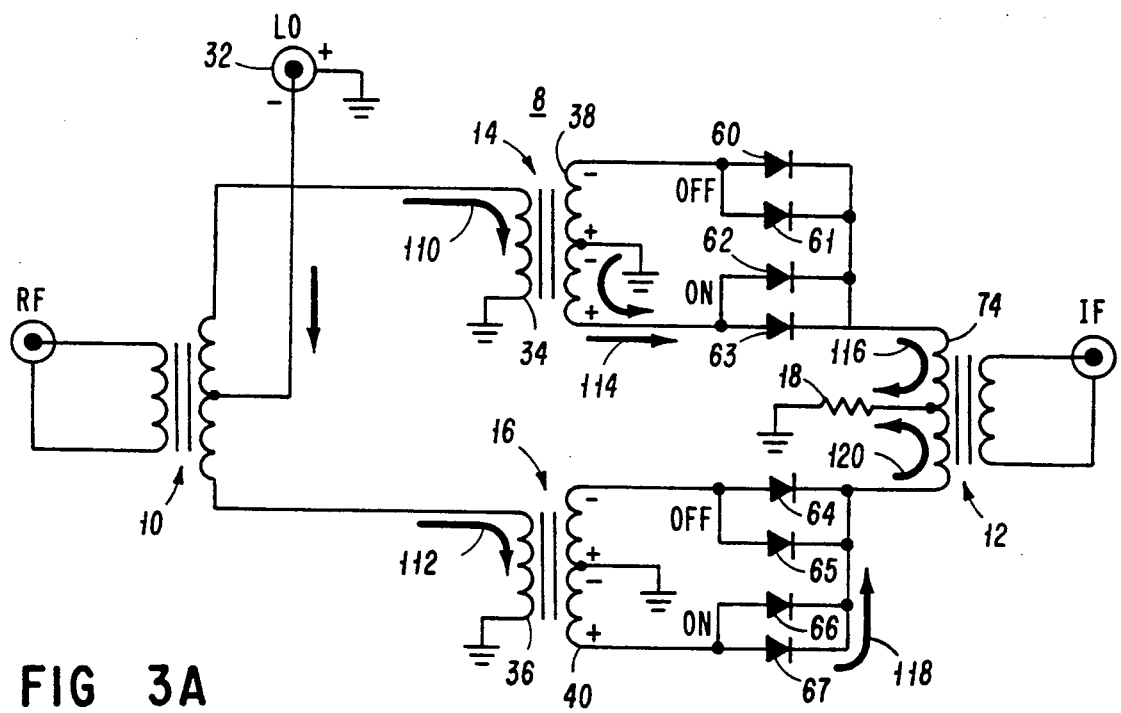
FIGS. 3A and 3B illustrate the response of the mixer circuit shown in FIG. 1 to local oscillator signals of different polarities.

Referring now to FIG. 3A, when the local oscillator signal source 32 has the polarity indicated, current due to the local oscillator signal flows down through the primaries 34 and 36 of the interface transformers 14 and 16 as indicated by the arrows 110 and 112. This current flow generates corresponding voltages in the secondaries 38 and 40 with the polarities as indicated resulting in forward biasing of the diodes 62, 63, 66 and 67 and back-biasing of the diodes 60, 61, 64 and 65. Therefore current flows through the diodes 62, 63, 66 and 67 into the secondary 74 of the output transformer 12 and through the bias resistor 18 to ground as indicated by the arrows 114, 116, 118 and 120. The diodes 62, 63, 66 and 67 are therefore turned on while the diodes 60, 61, 64 and 65 are turned off and "doubly" back-biased being subject to the full potential developed across the secondaries 38 and 40 of the transformers 14 and 16.

Figure 3B:
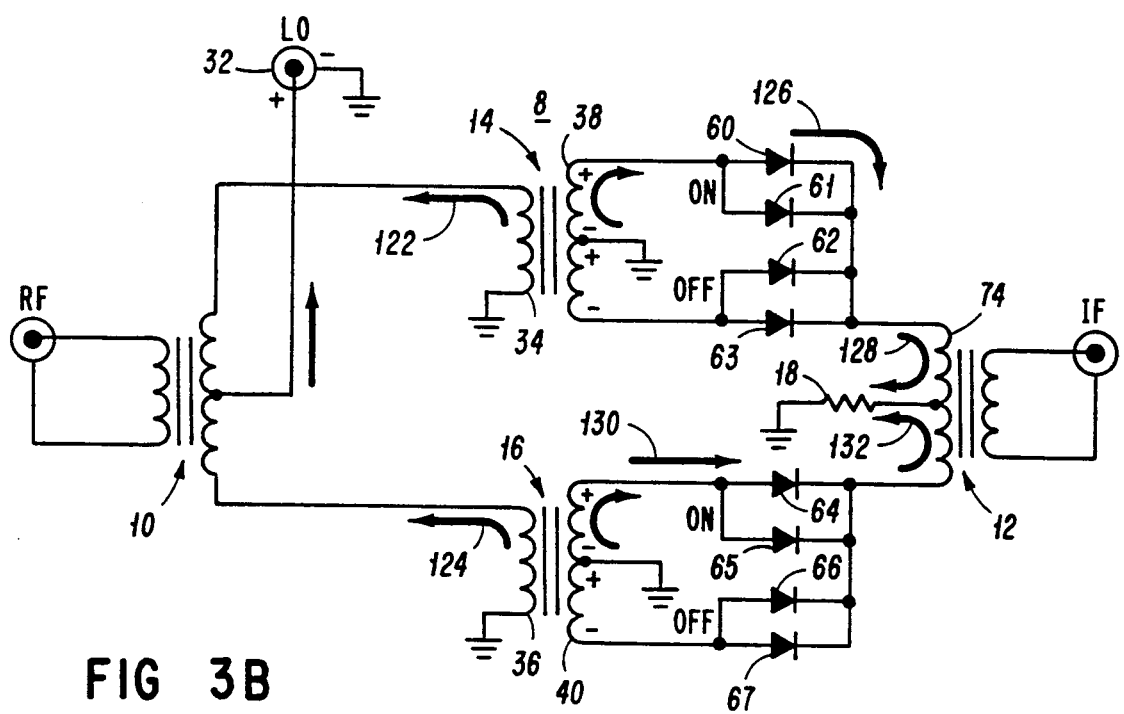

Referring now to FIG. 3B, when the local oscillator signal source 32 has a polarity reversed from the polarity shown in FIG. 3A, current due to the local oscillator signal flows up through the primaries 34 and 36 of the interface transformers 14 and 16 as indicated by the arrows 122 and 124. This current flow generates corresponding voltages and the secondaries 38 and 40 with the polarities indicated resulting in forward biasing of the diodes 60, 61, 64 and 65 and back-biasing of the diodes 62, 63, 66 and 67. Therefore, current flows through the diodes 60, 61, 64 and 65 into the secondary 74 of the output transformer 12 and through the bias resistor 18 to ground as indicated by the arrows 126, 128, 130 and 132. The diodes 60, 61, 64 and 65 are therefore turned on and the diodes 62, 63, 66 and 67 are turned off and "doubly" back-biased being subject to the full potential generated across the secondaries 38 and 40 of the transformers 14 and 16.

It is important to note that as the polarity of the signal from the local oscillator source 32 changes, selected subsets of the diodes 60–67 toggle on and then off, however, the current flow through the bias resistor 18 remains the same resulting in back-biasing of the diodes in the off condition to the extent of the full potential across the secondaries of the interface transformers 14 and 16. This back-biasing of the diodes results in very rapid switching action by the diodes 60–67 as the two subsets of these diodes toggle alternately on and off, thereby further promoting the suppression of intermodulation products in the output of the mixer circuit.

Figure 4A:
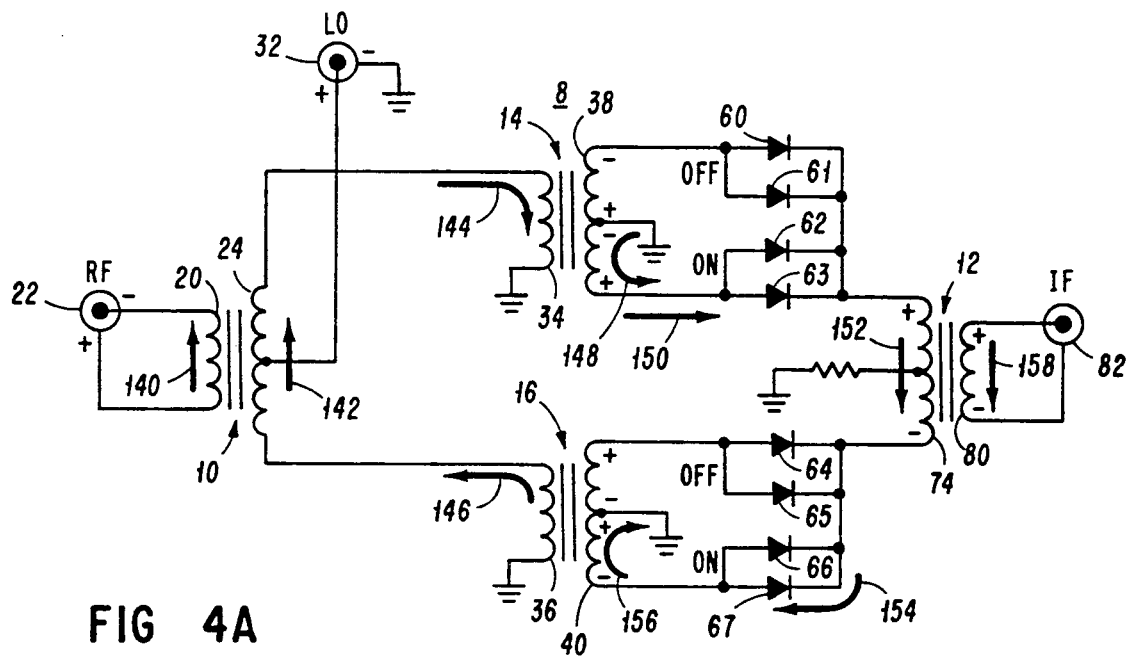
FIGS. 4A and 4B illustrate the response of the mixer circuit shown in FIG. 1 to a radio frequency signal of a given polarity as the polarity of the local oscillator signal changes.

Referring now to FIG. 4A, when the radio frequency signal source 22 has the polarity indicated, current due to the radio frequency signal flows up through the primary 20 and secondary 24 of the input transformer 10 as indicated by the arrows 140 and 142 and, consequently, flows down and up through the primaries 34 and 36 of the interface transformers 14 and 16 as indicated by the arrows 144 and 146. This current flow generates corresponding voltages in the secondaries 38 and 40 with the polarities indicated resulting in current flow through the diodes 62, 63, 66 and 67 (considering only current and polarities attributable to the RF signal) as these diodes are turned on in accordance with the polarity of the local oscillator signal source 32. This current flow (due to the RF signal) follows the paths indicated by the arrows 148, 150, 152, 154 and 156 down through the secondary 74 of the transformer 12 resulting in current flow through the primary 80 of the transformer 12 in accordance with the arrow 158 as per the polarity shown.

Figure 4B:
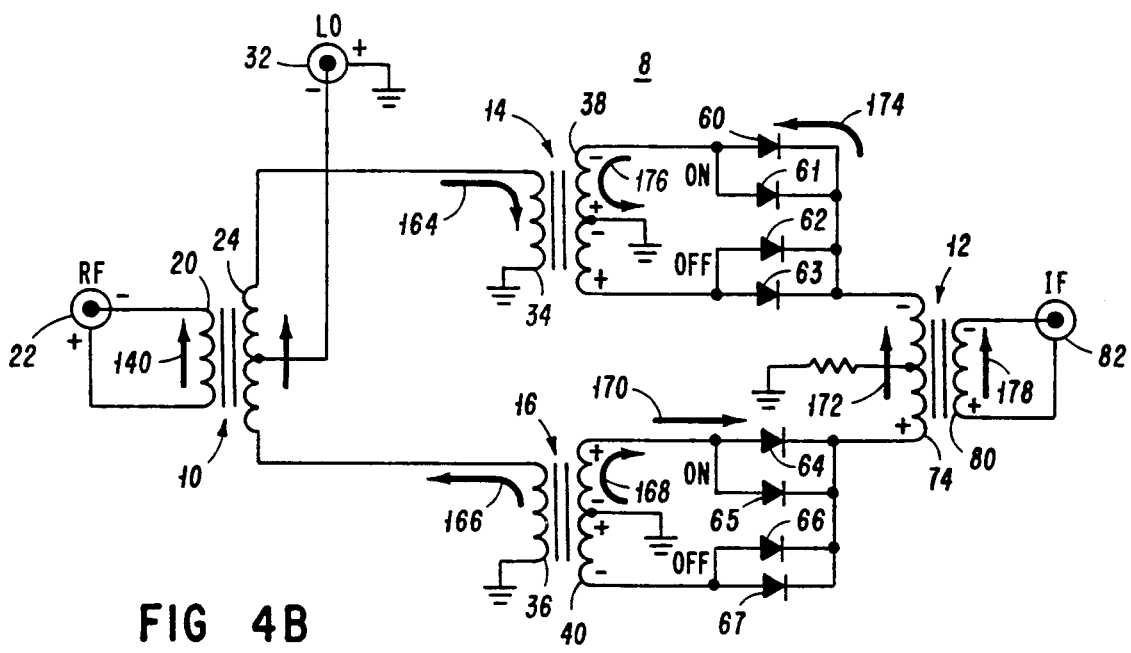

Referring now to FIG. 4B, when the radio frequency signal source 22 has the same polarity as that indicated in FIG. 4A but the local oscillator signal source has a reversed polarity from that shown in FIG. 4A, current due to the radio frequency signal again flows up through the primary 20 and secondary 24 of the input transformer 10 as indicated by the arrows 160 and 162 and, consequently, flows down and up through the primaries 34 and 36 of the interface transformers 14 and 16 as indicated by the arrows 164 and 166. This current flow generates corresponding voltages in the secondaries 38 and 40 with the polarities indicated resulting in current flow through the diodes 60, 61, 64 and 65 (considering again only current and polarities attributable to the RF signal) as these diodes are turned on in accordance with the reversed polarity of the local oscillator signal source 32. The current flow (due to the RF signal) now follows the paths indicated by the arrows 168, 170, 172, 174 and 176 up through secondary of the transformer 12 resulting in current flow through the primary 80 of the transformer in accordance as per the arrow 178 with the polarity shown.

Therefore, as the polarity of the signal from the local oscillator source 32 changes and selected subsets of the diodes 60-67 toggle on and then off, current flow due to the radio frequency signal is switched between the subsets of diodes 60-67. This switching action results in a reversal of the direction of current flow through the primary 74 and secondary 80 of the transformer 12 in accordance with the local oscillator signal whereby the mixing action of the present invention is performed and a radio frequency signal from the source 22 having alternating polarity in accordance with the local oscillator signal from the source 32 is provided to the intermediate frequency load 82.

Figure 5:
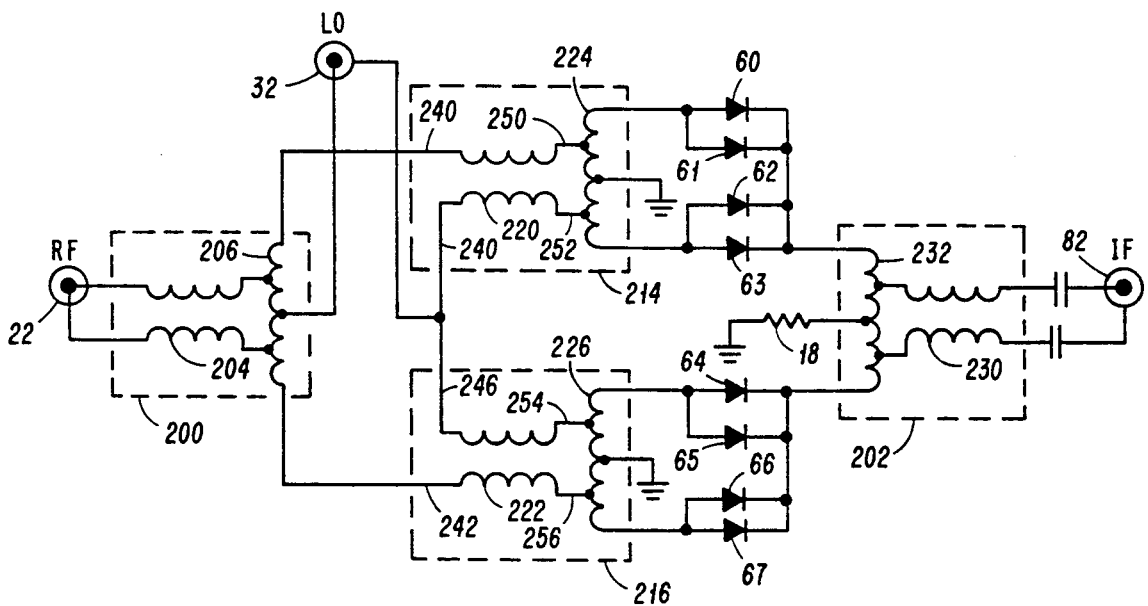
FIG. 5 provides a schematic diagram of the construction and arrangement of an alternate embodiment of the present invention employing baluns and autotransformers for coupling signals in and out of the mixer circuit.

Referring now to FIG. 5, an alternate embodiment of the present invention is shown which is identical with the embodiment of FIG. 1 except that in each case baluns and autotransformers have been substituted for the input and output transformers 10, 12, 14 and 16 of FIG. 1. The transformer mechanism 200 includes the balun 204 and the autotransformer 206 with opposite ends of the balun connected across the quarter-tap terminals of the autotransformer 206 and the radio frequency signal source 22. The balun 204 couples the radio frequency signal into the autotransformer 206. The interface transformer mechanisms 214 and 216 include baluns 220 and 222 and autotransformers 224 and 226, respectively. The end terminals 240 and 242 of the baluns 220 and 222 are connected to the opposite end of terminals of the secondary of the autotransformer 206. The end terminals 244 and 246 of the baluns 220 and 222 are connected to one terminal of the local oscillator signal source 32. The opposite set of end terminals 250 and 252 and 254 and 256 of the baluns 220 and 222 are connected to the quarter-tapped terminals of the autotransformers 224 and 226, respectively. The baluns 220 and 222 couple the local oscillator signal and radio frequency signal into the autotransformers 224 and 226. The output transformer mechanism 202 contains the balun 230 and the autotransformer 232. Opposite ends of the balun 230 are connected across the intermediate frequency load and the quarter-tapped terminals of the autotransformer 232 for coupling the intermediate frequency signal out of the autotransformer 232. The autotransformers 206, 232, 224 and 226, may be considered as functioning in place of the secondary coils of the transformers 10, 12, 14 and 16, respectively, and the baluns may be considered as functioning in place of the primary coils shown in the same transformers, although the operation of these units is not exactly comparable. The combinations of baluns and autotransformers described above comprising the transformer mechanisms 200, 202, 214 and 216 provide a greater degree of balance, a better broadband performance in the mixer circuit of the present invention.

While particular embodiments of the present invention have been shown and described, it should be clear that changes and modifications may be made to such embodiments without departing from the true scope and spirit of the invention. For example, the arrangement of the diodes 60-67 in the mixer circuit 8, shown in FIG. 1, may be revised so that their anodes are connected to the end terminals 70 and 72 of the transformer 12 and their cathodes are connected to the end terminals 46, 48, 50 and 52 while still allowing the circuit to operate in accordance with the same basic principles of operation. It is intended that the appended claims cover all such changes and modifications.

I claim:

1. A double-balanced mixer circuit, comprising:
   a first transformer having a primary coupled to a radio frequency signal source and a center-tapped secondary with its center tap terminal connected to a local oscillator signal source;
   a second transformer including a primary having a first end terminal connected to one end terminal of the secondary of said first transformer and a second end terminal connected to ground and including a center-tapped secondary having its center taped connected to ground;
   a third transformer including a primary having a first end terminal connected to the other end terminal of the secondary of said first transformer and a second end terminal connected to ground and including a center-tapped secondary having its center tap connected to ground;
   a fourth transformer having a primary coupled to an intermediate frequency load and a center-tapped primary with its center tap terminal connected to ground through a bias resistor; and
   a plurality of diodes connected in parallel for linking the end terminals of the secondaries of said second and third transformers to the primary of said fourth transformer in order to thereby enable rapid switching action by said diodes.

2. The mixer circuit of claim 1, wherein different subsets of said plurality of diodes are arranged so that their cathodes are connected to the different end terminals of the primary of said fourth transformer, and different groups within said subsets are arranged so that their anodes are connected to different terminals of the secondaries of said second and third transformers.

3. The mixer circuit of claim 1, wherein said diodes comprise hot-carrier diodes.

4. The mixer circuit of claim 1, wherein one or more of said transformers comprise autotransformers and baluns.

5. The mixer circuit of claim 1, wherein one or more of said transformers comprises three leads wound on a toroidal core including two contactually wound secondary leads comprising a set of turns defining a secondary winding and a single primary lead wound in between the turns of said secondary winding so as to be equally spaced apart from said turns of said secondary winding.

6. A mixer circuit, comprising:
   an input transformer means having a primary and a secondary separately connected to radio frequency and local oscillator signal sources;
   an output transformer means having a primary connected across an intermediate frequency load and a center-tapped secondary connected at its center tap to a bias resistor
   means for interfacing said input transformer to said output transformer including first and second interface transformers having their primaries connected to said input transformer and their secondaries connected to a plurality of switching elements, said interface transformers and said plurality of switching elements constructed and arranged for applying said local oscillator signal across said secondary of said output transformer in a push-push mode, applying said radio frequency signal across the secondary of said output transformer in a push-pull mode and back-biasing one or more of said switching elements when they are in the off condition in order to promote rapid switching action.

7. The mixer circuit of claim 6, wherein said input transformer includes a primary connected to said radio frequency signal source and a center-tapped secondary with its center tap terminal connected to said local oscillator signal source.

8. The mixer circuit of claim 7, wherein said first and second transformers have primaries connected to opposite end terminals of the secondary of said input transformer and center-tapped secondaries with their center taps connected to ground and with the end terminals of said first transformer coupled through one or more of said switching elements to one of the end terminals of the primary of said output transformer and the end terminals of said second transformer coupled through one or more of said switching elements to the other end terminal of the primary of said output transformer.

9. The mixer circuit of claim 8, wherein said plurality of switching elements comprise diodes which are arranged so that their cathodes are connected to the end terminals of the primary of said output transformer.

10. The mixer circuit of claim 6, wherein said switching elements comprise hot-carrier diodes.

11. The mixer circuit claim 6, wherein one or more of said transformer comprise autotransformers and baluns.

12. The mixer circuit of claim 6, wherein one or more of said transformers comprises three leads wound on a toroidal core including two contactually wound secondary leads comprising a set of turns defining a secondary winding and a single primary lead wound in between the turns of said secondary winding so as to be equally spaced apart from said turns of said secondary winding.

13. A double-balanced mixer circuit, comprising:
   a first autotransformer and first balun interconnected together and separately connected to a radio frequency signal source and a local oscillator signal source for coupling said mixer circuit to said radio frequency signal source and said local oscillator signal source;
   a second autotransformer and second balun interconnected together and connected to an intermediate frequency load for coupling said mixer circuit to a bias resistor connected to the center tap terminal of said autotransformer and to said intermediate frequency load;
   means for interfacing said first and second autotransformers and baluns including third and fourth autotransformers and third and fourth baluns and a plurality of diodes constructed and arranged for applying the local oscillator signal across said second autotransformer in a push-push mode, applying the radio frequency signal to said second autotransformer in a push-pull mode and back biasing said diodes when they are in the off condition in order to promote rapid switching action by said diodes.

14. The mixer circuit of claim 13, wherein said third and fourth baluns are connected to said first autotransformer and said third and fourth autotransformers are coupled to said second autotransformer through said diodes.

15. The mixer circuit of claim 13, wherein said diodes comprise hot-carrier diodes arranged so that their cathodes are connected to the end terminals of said second autotransformers.

* * * * *